United States Patent [19]
Andrews

[11] Patent Number: 5,543,611
[45] Date of Patent: Aug. 6, 1996

[54] METHOD AND APPARATUS FOR BACK FACET MONITORING OF LASER DIODE POWER OUTPUT

[75] Inventor: John R. Andrews, Fairport, N.Y.

[73] Assignee: Xerox Corporation, Stamford, Conn.

[21] Appl. No.: 384,174

[22] Filed: Feb. 6, 1995

[51] Int. Cl.⁶ .............................. G01D 15/14; G01J 1/32
[52] U.S. Cl. .......................... 250/205; 250/235; 358/493
[58] Field of Search ........................... 250/205, 214 AG, 250/234, 235, 236; 358/493, 494

[56] References Cited

U.S. PATENT DOCUMENTS

| | | | |
|---|---|---|---|
| 4,342,050 | 7/1982 | Traino | 358/256 |
| 4,443,695 | 4/1984 | Kitamura | 250/214 AG |
| 4,675,518 | 6/1987 | Oimura et al. | 250/205 |
| 4,724,314 | 2/1988 | Caimi | 250/205 |
| 4,727,382 | 2/1988 | Negishi et al. | 346/108 |
| 4,796,964 | 1/1989 | Connell et al. | 350/6.8 |
| 4,825,064 | 4/1989 | Ando | 250/205 |
| 5,166,509 | 11/1992 | Curran | 250/205 |
| 5,311,216 | 5/1994 | Hirahata et al. | 346/108 |
| 5,345,074 | 9/1994 | Tonai et al. | 250/205 |

Primary Examiner—Stephone Allen

[57] ABSTRACT

The present invention presents an apparatus and method for efficiently and automatically monitoring the power output of laser diodes used to provide the scanning beams in a ROS system. Light radiated from the back facet of the laser diode is focused by a projection means, in a preferred embodiment, a ball lens onto a photosensor. The photosensor output is proportional to the power output of the diode associated with the photosensor. The use of a projection means provides immunity from stray light and from cross talk between closely positioned laser diodes in a multiple diode configuration and yield increase sensitivity of the photosensor.

3 Claims, 2 Drawing Sheets

METHOD AND APPARATUS FOR BACK FACET MONITORING OF LASER DIODE POWER OUTPUT

BACKGROUND AND DISCLOSURE STATEMENT

The present invention relates generally to the monitoring of output power of semiconductor laser diodes and particularly to the monitoring of the output power of laser diodes by detecting radiation emitted from the laser diode back facet.

It is well known in the scanning art to use diode lasers to generate a coherent laser beam which is used to scan a recording medium surface. It is also known to use multiple laser diodes to create multiple beams, each individual beam independently modulated by video signals, and the multiple beams scanned onto the recording surface as modulated beams. For these multiple beam applications, it has been found advantageous to use arrays of closely spaced laser diodes. Closely spaced diodes allow for multiple beam processing and thus improve data throughout as compared with older systems that employ continuous wave, single beam gas or semi-conductor lasers.

Typically, the laser diodes are individually addressable. Individual addressability generally requires that each diode have a separate current source that drives or modulates the diode. In operation, each driver sends a current through the diode sufficient to induce emission of laser light. The amount of current the driver produces is determined, in part, by the digital input data driving that particular lasing element. An example of a ROS system using a dual laser diode is disclosed in U.S. Pat. No. 4,796,964, whose contents are hereby incorporated by reference.

Because different laser diodes have different output power characteristics in response to a given driving current, it is desirable to monitor the amount of output power from each laser diode. If it is found that a particular diode is outputting too much or too little power at a given current level then the current needs to be adjusted to correct for the power differential. Laser diodes are typically constructed layer by layer from epitaxial deposition of appropriately doped semiconductor material. The front and back facets are then cleaved to produce reflective surfaces that define the front and back boundaries of the laser cavity. The front facet is designed to be more transmissive than the back facet which is generally made to be highly reflective. The front facet is thus the side from which the majority of laser light is emitted.

As stated above, the back facet is frequently also designed to be a highly reflective surface. However, some light ultimately escapes through the back facet of the diode. The amount of light leakage through the back facet is generally known to be proportional to the amount of light emitted from the front facet. This relationship between radiation from the back facet and the radiation from the front facet affords the opportunity to monitor the amount of output power from the front facet by detecting light emitted from the back facet.

To measure the amount of light from the back facet of a diode, a detector is typically disposed opposite the back facet of a single laser diode. In the case of a single laser diode configuration, one back facet detector gives complete information concerning the amount of radiation emanating from the front facet of that diode. In a multi-diode configuration, the confluence of concurrent, multiple beams does not give information concerning any particular diode.

FIG. 1 shows a top perspective view of a prior art Raster Output Scan (ROS) system 12 which includes a single laser diode 15 whose output is monitored by back facet detection. The ROS scans a data modulated beam 13 onto a xerographic photoreceptor drum 14 in accordance with a predetermined raster scanning pattern. ROS 12 comprises a laser diode 15 which is driven in accordance with image signals entered into, and processed by, ESS 16. Laser 15 emits light beam 13. A polygon scanner 17 is optically aligned between laser 15 and the drum 14 and rotated so that facets 18 intercept the output beams and cause the beams to be swept across the drum surface in a fast scan direction. Pre-scan optics 20 and post-scan optics 22 contain conventional optical elements which are used for beam forming and correction purposes.

The laser diode 15 has front and back facets 15A, 15B, respectively. While the majority of the laser light escapes from the front facet as beam 13, some radiation in the form of beam 13' is emitted from the back facet of the diode. This radiation is detected by a photosensor 24 which generates an output signal which is sent to ESS 16. ESS 16 then processes this signal comparing it to a predetermined voltage level corresponding to the desired power output of the diode. If correction is needed, a signal is sent to the drive circuit for the laser to increase or reduce the laser power output. As can be seen from FIG. 1, the light from the front and back facets spreads out in a conic shape. Other prior art disclosures which utilize a back facet detection are found in U.S. Pat. Nos. 4,342,050, 4,727,382 and 5,311,216.

For a multiple diode configuration, a single back facet photosensor opposite the laser diodes cannot simultaneously provide discernible information concerning the output power of any one laser diode since the overlapping of concurrent multiple beams does not give information concerning any particular diode. While each laser diode can be monitored separately by alternately turning each diode on and off, it is more efficient to be able to separately and simultaneously measure the light intensity of each laser diode.

Thus there is a need to construct an array architecture such that the amount of light emitted from individual back facets, of a multiple diode configuration is detected. Additionally, there is a need to regulate the output of the individual diodes in a continuous closed loop configuration to insure high print quality.

It is thus a first object of the present invention to provide a back facet monitoring system such that the amount of output power from individual back facts of laser diodes can be individually monitored in a continuous fashion.

There are additional prior art problems in back facet monitoring. In typical laser designs, up to 99.5% of the back facet is coated with a reflective material. Thus only a small amount of light (0.5%) is emitted from the back facet and is available to measure the power. Thus, photosensor 24 in FIG. 1, which is typically placed several millimeters behind laser 15, collects only a relatively small fraction of the already reduced light emitted from back facet 15B.

It is therefore a second object of the present invention to increase the sensitivity of the back facet light detector.

Another problem of prior art systems is stray light impinging on detector 24 distorting the output signal. The stray light is the result of reflections from the optical components in the system (e.g., from the optical components in pre-scan optics 20) being reflected from the rear facet and onto the detector. The detected signal will be distorted due to the optically induced "noise". For multiple diodes, increased "cross talk" results.

It is therefore a still further object of the invention to reduce the effects of stray light interference on back facet power monitoring detector signals.

These and other objects are realized by introducing an imaging component between the back facet and a small area photosensor with a fast response time. In one embodiment, the back facet light emissions from a dual emitter diode array are imaged onto 2 small photosensors formed on an array. More particularly, the present invention relates to an apparatus for monitoring the power output of at least a laser diode having at least a front and back facet, said apparatus comprising:

imaging means proximate said back facet and optically aligned with said back facet so that light emitted therefrom is imaged by said imaging means onto an imaging plane, and at least one photosensor optically aligned with said imaging means and disposed in said imaging plane wherein said imaged light is focused onto said photosensor generating an output signal therefrom, said output signal being proportional to said power output.

DESCRIPTION OF THE INVENTION

The following description is presented to enable any person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

Figure 1:
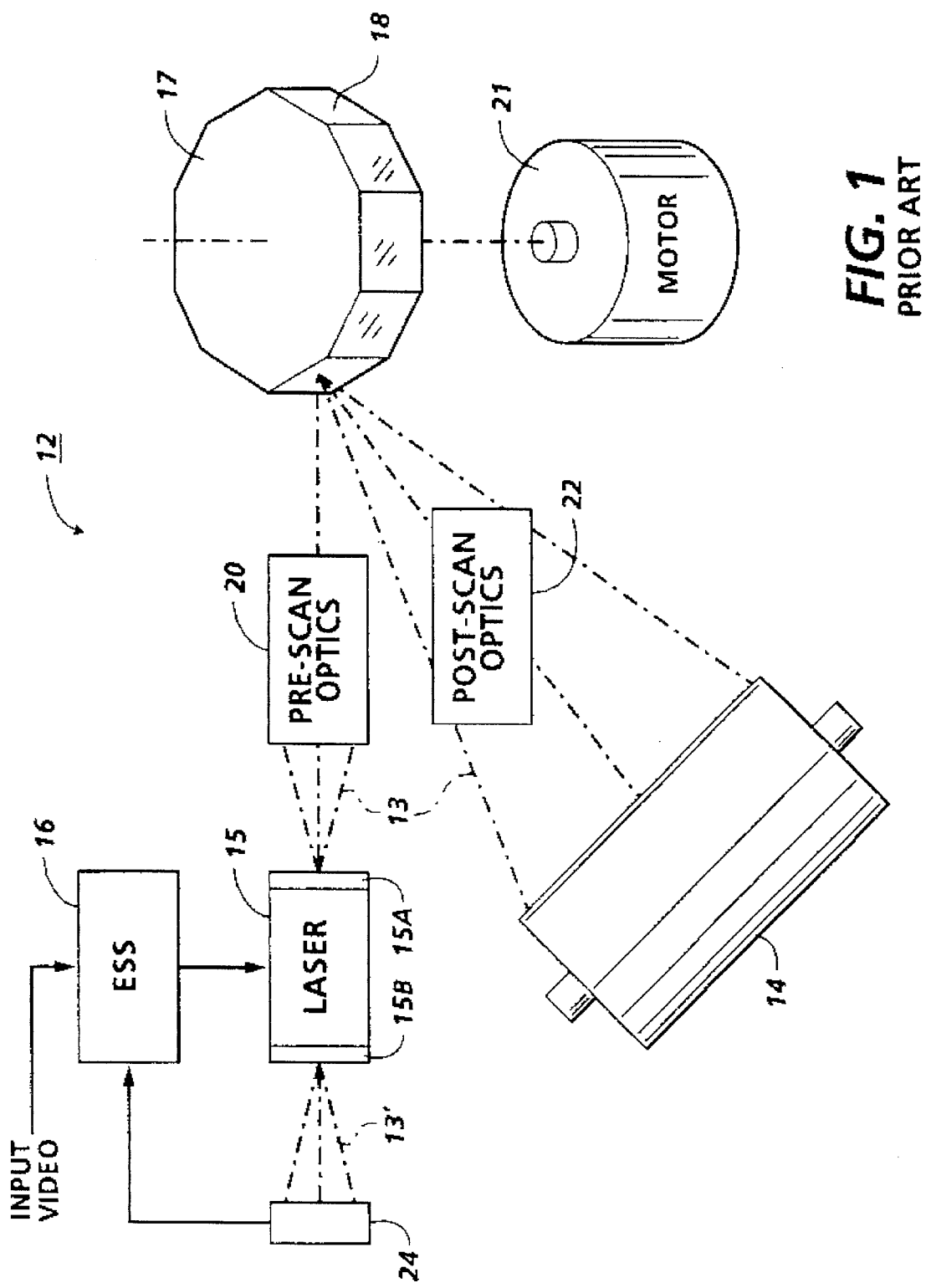
FIG. 1 is a perspective view of a prior art ROS scanning system showing back facet power monitoring for a single laser diode.
Figure 2:
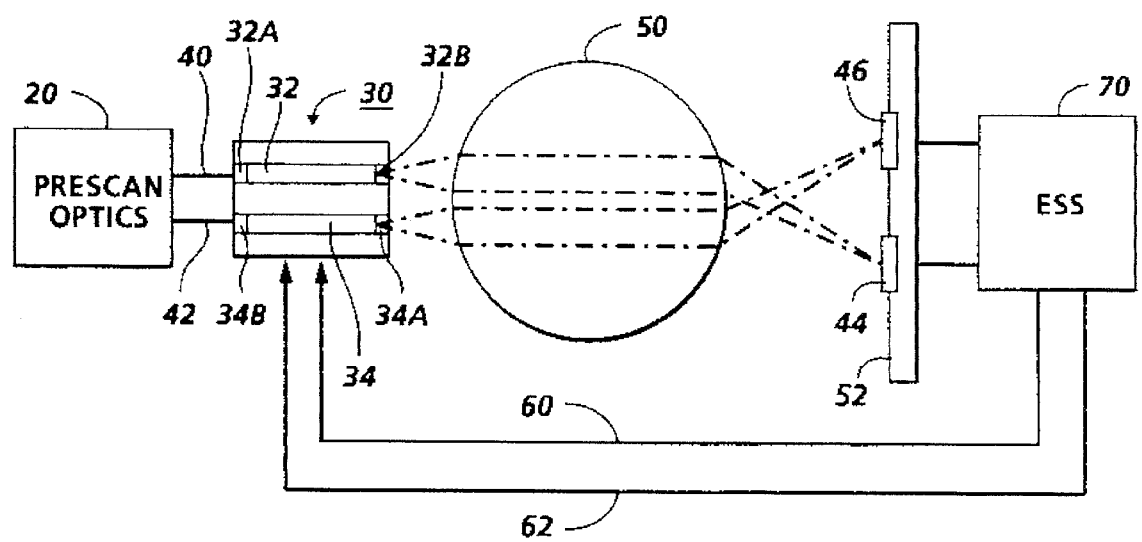
FIG. 2 shows a top view of a preferred embodiment of the invention which includes a ball lens to focus back facet light outputs from two laser diodes onto two photosensors.

Referring to FIG. 2, a top view of one embodiment of the present invention having two laser diodes as shown. An array 30 is comprised of laser diodes 32, 34. Array 30 can be used to provide beams, beams 40, 42 used for beam scanning purposes in a ROS system of the type disclosed, for example, in U.S. Pat. No. 4,796,964. Diode 32 has a front facet 32A and back facet 32B; diode 34 has a front facet 34A and a back facet 34B. The light emitted from back facets 32B, 34B is focused onto photosensors 44, 46, respectively, by a focusing element which in a preferred embodiment is a ball lens 50. Photosensors 44, 46 are formed on a linear array 52.

This arrangement collects an appreciable fraction of the light from the back facet of each laser and images the emitted light onto a photosensor. By collecting an appreciable fraction of the light emitted by each laser (30%–90% of the light emitted from back facets 32B, 34B) and imaging the light onto photosensors 44, 46, the maximum sensitivity of each sensor is realized. Since each back facet output is imaged onto a separate photosensor, the output of each diode can be detected independent of the other.

Thus, each photosensor 44, 46 generates an output signal which is proportional to the power output of diodes 32, 34, respectively. The output signals are sent along electrical connection wires 60, 62 to ESS 70 which contains the drive circuitry for each diode. The ESS compares output signals from the photosensor to signals representing optimum power levels for each laser diode and adjusts the driver signals to maintain this power output level. Since the individual diodes are focused, this permits the use of very small area photosensors thereby permitting them to have fast response times when operated under appropriate conditions. Finally, the small photosensor area and the focusing element at the rear of the laser means that any stray light that does not have an apparent origin the same as the laser array, will be spread over a large area and therefore contribute only a very small noise signal. Though the focusing element in FIG. 2 is a spherical ball lens, a diffractive or holographic lens or a reflective spherical mirror could be used among other choices to focus the back facet light output onto the photosensor. Since the spot shape and quality at the photosensor is not important, aberrations induced by the lens are not critical. The approach is compatible with hybrid laser arrays as well as lasers of arbitrary polarization.

In a preferred embodiment, diodes 32, 34 are bonded to array 30 using conventional techniques. The ball lens 50 is soldered in place using a metal bonding pad that is placed on the lens in a standard commercially available configuration. The detector array 52 is made by silicon pin technology of a semi-custom pattern using standard processes. The optoelectronic package that the components shown in FIG. 2 would be seated in would be a semi-custom package. Additional features of the invention would be a window at the front of array 36 so that the laser diodes can be conventionally coupled to the pre-scan optics so that each laser can be driven independently and so that the photosensors in the array can be individually detected, and if speed is required, biased independent of the laser. The laser heatsink in base 74 is conventional and the bonding spot for the ball lens is moved from the conventional front facet position to the rear facet position.

Figure 3:
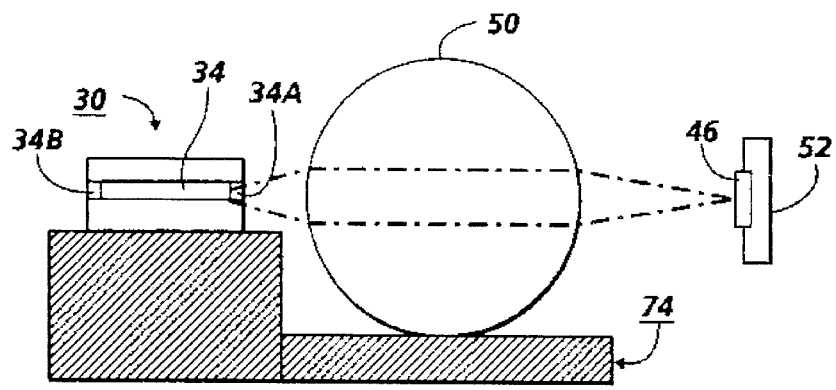
FIG. 3 shows a side view of the FIG. 2 embodiment.

While a two diode laser array is described in the embodiment of FIGS. 2 and 3, it is understood that the invention can be practiced with a single laser diode or with a multiple number of laser diodes; e.g. 4, 6.

While the embodiment disclosed herein is preferred, it will be appreciated from this teaching that various alternative, modifications, variations or improvements therein may be made by those skilled in the art, which are intended to be encompassed by the following claims:

What is claimed is:

1. Apparatus for monitoring the power outputs of a plurality of laser diodes, comprising: a plurality of laser diodes mounted so as to form a laser diode array, wherein each laser diode includes a front facet for emitting laser light and a back facet for emitting laser light, wherein the laser light emitted from the front facet has an intensity greater than the laser light emitted from the back facet;

an imaging device proximate the back facet; and a plurality of photosensors for receiving laser light, each photosensor generating an output signal proportional to the intensity of the laser light received;

wherein said imaging device includes a ball lens which focuses the laser light from each laser diode onto a separate photosensor.

2. A method for monitoring the output power of a plurality of individual laser diodes comprising the steps of:

disposing a plurality of photosensors proximate the back facet of each of the laser diodes and disposing a ball lens between the back facets of each laser diode and each of said photosensor such that the laser light emitted from the back facets of each laser diode passes through said ball lens and is focused onto an individual photosensor.

3. A multi-beam scanning optical system for simultaneously scanning an imaging plane with a plurality of laser beams, comprising:

a plurality of semi-conductor lasers, each laser emitting a first beam of laser radiation at a characteristic intensity level through a front facet and a second beam of laser radiation at a characteristic intensity level through a back facet;

a laser drive circuit response to control signals, said laser drive circuit driving each of said lasers to output its first beam and its second beam such that the intensities of those first and second beams depend on the control signals;

a plurality of photosensors, each photosensor generating an output signal representative of the intensity of light incident thereon;

an image projector focusing the laser beam from the back facet of each laser onto an associated photosensor; and a feedback circuit generating control signals from the photosensor output signals such that the control signals act to maintain the first beam of each laser at its characteristic level;

wherein said imaging projector includes a ball lens.

* * * * *